US009171438B2

(12) United States Patent
Kikuchi et al.

(10) Patent No.: US 9,171,438 B2
(45) Date of Patent: Oct. 27, 2015

(54) MULTI-AXIS PHOTOELECTRIC SENSOR

(75) Inventors: Keisaku Kikuchi, Shiga-ken (JP);
Kazunori Osako, Shiga-ken (JP)

(73) Assignee: OMRON CORPORATION, Kyoto (JP)

( * ) Notice: Subject to any disclaimer, the term of this patent is extended or adjusted under 35 U.S.C. 154(b) by 208 days.

(21) Appl. No.: 13/991,560

(22) PCT Filed: Mar. 17, 2011

(86) PCT No.: PCT/JP2011/056349
§ 371 (c)(1),
(2), (4) Date: Sep. 18, 2013

(87) PCT Pub. No.: WO2012/081265
PCT Pub. Date: Jun. 21, 2012

(65) Prior Publication Data
US 2014/0002264 A1 Jan. 2, 2014

(30) Foreign Application Priority Data

Dec. 17, 2010 (JP) ................................. 2010-282370

(51) Int. Cl.
*G08B 13/18* (2006.01)
*B60C 23/00* (2006.01)
(Continued)

(52) U.S. Cl.
CPC ............... *G08B 13/183* (2013.01); *G01V 8/20* (2013.01); *G08B 21/02* (2013.01); *H03K 17/943* (2013.01); *H03K 2217/94104* (2013.01); *H03K 2217/94114* (2013.01); *H03K 2217/94116* (2013.01)

(58) Field of Classification Search
CPC ............. G01V 8/20; G01V 8/10; G01V 8/12; G01V 8/22; F16P 3/14; F16P 3/144; G01C 15/002; G01N 2033/0081; G01S 17/026; G01S 17/88; G01S 7/486; G05B 19/0428; G05B 19/058; G05B 2219/24008

USPC ......... 340/556, 443, 447, 449, 500, 933, 988; 307/9.1, 10.1, 149, 326, 101, 43, 80, 307/82, 104, 84, 86
See application file for complete search history.

(56) References Cited

U.S. PATENT DOCUMENTS 5,008,531 A * 4/1991 Ono et al. ................... 250/222.1
5,318,172 A * 6/1994 Kenny et al. ................... 209/524
(Continued)

FOREIGN PATENT DOCUMENTS

JP         2006-284355      10/2006
JP         2009-63362       3/2009
(Continued)

OTHER PUBLICATIONS

International Search Report, dated Apr. 19, 2011.

*Primary Examiner* — Fekadeselassie Girma
(74) *Attorney, Agent, or Firm* — Greenblum & Bernstein P.L.C.

(57) ABSTRACT

Provided is a multi-axis photoelectric sensor that outputs a high-level signal while a detection area is not shielded and stops the signal output when the detection area is shielded, wherein a sequence of a change in a non-shielded state and in a shielded state of the detection area formed by optical axes and inputs from muting sensors are divided into a plurality of stages for monitoring, and muting processing is executed when the stages progress normally. When an abnormality in the sequence is detected in a stage being monitored, indicator lights are blinked by a number of times corresponding to the stage in which the abnormality has been detected, to provide a notification of a stage in which the abnormality has been detected.

6 Claims, 8 Drawing Sheets

(51) Int. Cl.
   *G08G 1/01* (2006.01)
   *B60L 1/00* (2006.01)
   *H02H 11/00* (2006.01)
   *G08B 13/183* (2006.01)
   *G01V 8/20* (2006.01)
   *H03K 17/94* (2006.01)
   *G08B 21/02* (2006.01)

(56) References Cited

U.S. PATENT DOCUMENTS

| | | | | |
|---|---|---|---|---|
| 5,496,996 | A * | 3/1996 | Barnes et al. | 250/223 B |
| 5,828,056 | A * | 10/1998 | Alderman et al. | 250/223 B |
| 5,880,954 | A * | 3/1999 | Thomson et al. | 700/79 |
| 7,191,034 | B2 * | 3/2007 | Whitten et al. | 700/244 |
| 7,329,854 | B2 * | 2/2008 | Clifton et al. | 250/221 |
| 7,742,837 | B2 * | 6/2010 | Hair et al. | 700/236 |
| 7,821,394 | B2 * | 10/2010 | Fukumura | 340/556 |
| 7,896,196 | B2 * | 3/2011 | Wegelin et al. | 222/52 |
| 8,115,914 | B2 * | 2/2012 | Osako et al. | 356/218 |
| 8,319,172 | B2 * | 11/2012 | Klein et al. | 250/221 |
| 8,548,625 | B2 * | 10/2013 | Whitten et al. | 700/244 |
| 2001/0030743 | A1 * | 10/2001 | Araujo | 356/152.2 |
| 2005/0063114 | A1 * | 3/2005 | Suhara et al. | 361/62 |
| 2006/0238492 | A1 * | 10/2006 | Fouquet et al. | 345/156 |
| 2008/0179504 | A1 * | 7/2008 | Inoue et al. | 250/221 |
| 2008/0179505 | A1 * | 7/2008 | Inoue et al. | 250/221 |
| 2009/0058642 | A1 * | 3/2009 | Fukumura | 340/556 |
| 2010/0219326 | A1 * | 9/2010 | Klein et al. | 250/201.1 |
| 2014/0002264 | A1 * | 1/2014 | Kikuchi et al. | 340/556 |

FOREIGN PATENT DOCUMENTS

| | | |
|---|---|---|
| JP | 2009-225012 | 10/2009 |
| JP | 2010-133765 | 6/2010 |

* cited by examiner

Fig. 5

| | Status | Position of work piece | Abnormality to be detected |
|---|---|---|---|
| Before muting | Stage 1<br><br>A, B: OFF,<br>LC: non-shielded state | W, 10(20), S, RD, A1 B1, A2 B2 | • B is turned ON before A is turned ON<br>• A and B are tuned ON simultaneously |
| Before muting | Stage 2<br><br>A: ON, B: OFF,<br>LC: non-shielded state | W, 10(20), S, RD, A1 B1, A2 B2 | • B is turned ON before elapse of minimum waiting time<br>• B is not tuned ON even after elapse of maximum waiting time |
| Before muting | Stage 3<br><br>A, B: ON,<br>LC: non-shielded state | W, 10(20), S, RD, A1 B1, A2 B2 | LC is shielded before elapse of time T |
| During muting | Stage 4<br><br>A, B: ON, LC: non-shielded state (Elapse of time T from start of stage 3) | W, 10(20), S, RD, A1 B1, A2 B2 | • LC is shielded before elapse of minimum waiting time<br>• LC is not shielded even after elapse of maximum waiting time |
| During muting | Stage 5<br><br>A, B: ON,<br>LC: shielded state | W, 10(20), S, RD, A1 B1, A2 B2 | • LC is switched to non-shielded state before elapse of minimum waiting time<br>• LC is not switched to non-shielded state even after elapse of maximum waiting time |
| During muting | Stage 6<br><br>A, B: ON,<br>LC: non-shielded state | 10(20), S, W, RD, A1 B1, A2 B2 | • A is turned OFF before elapse of minimum waiting time<br>• A is not tuned OF even after elapse of maximum waiting time |
| End of muting | Stage 7<br><br>A: OFF, B: ON,<br>LC: non-shielded state | W', 10(20), S, W, RD, A1 B1, A2 B2 | A is turned ON before B is tuned OFF |

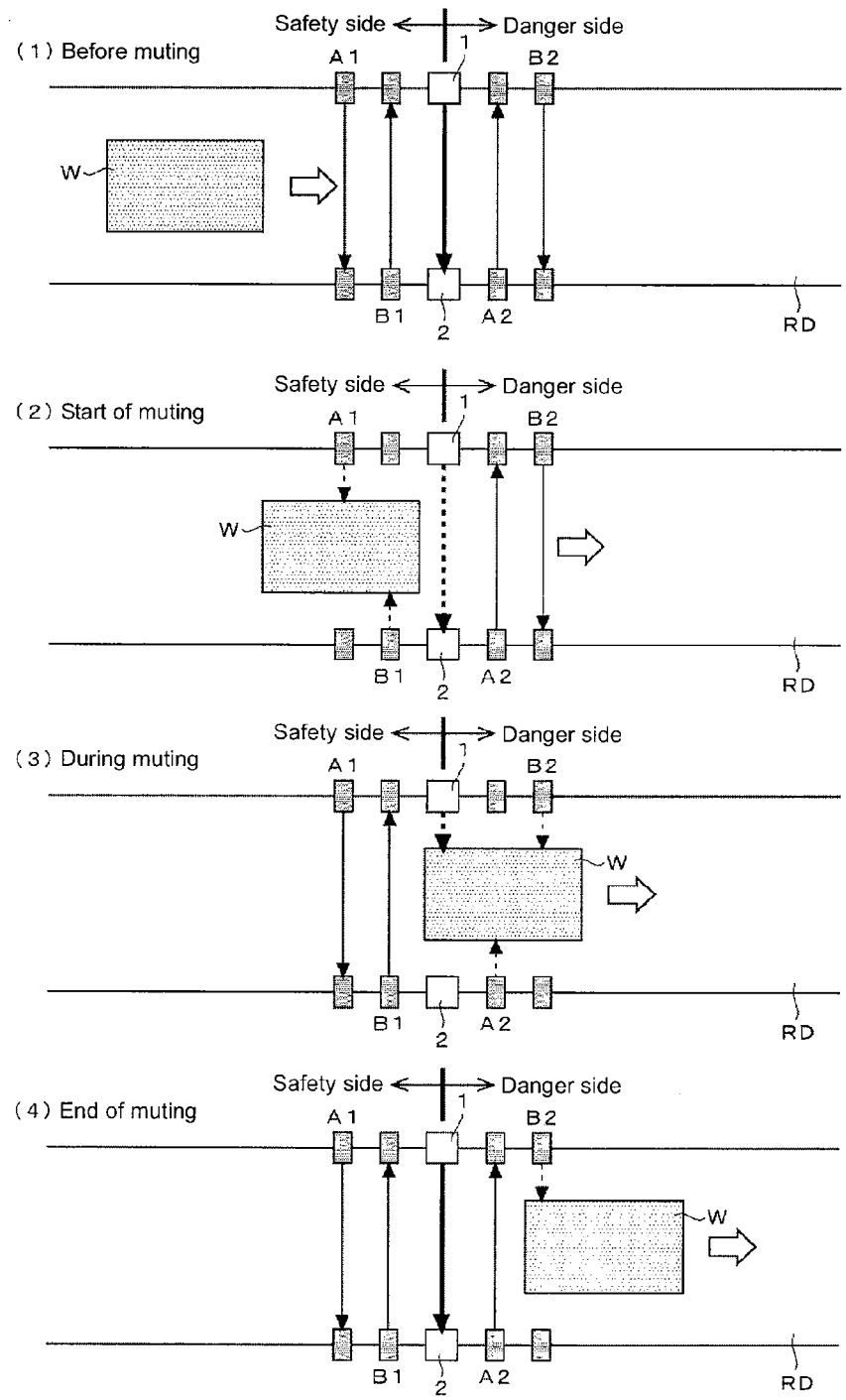

MULTI-AXIS PHOTOELECTRIC SENSOR

TECHNICAL FIELD

The present invention relates to a safety multi-axis photoelectric sensor in which a detection area formed by a plurality of optical axes is set between a projector and an optical receiver and which outputs a high-level signal while the detection area is not shielded by an object and stops outputting the signal when the detection area is shielded. In particular, the present invention relates to a multi-axis photoelectric sensor capable of executing muting processing that temporarily disables the function of stopping the signal output.

BACKGROUND ART

A multi-axis photoelectric sensor includes an elongated projector and an elongated optical receiver having light emitting elements and light receiving elements in their casings, respectively. The light emitting elements and light receiving elements are arranged so as to be opposed one by one, whereby a detection area (light curtain) is formed by a plurality of optical axes. The multi-axis photoelectric sensor used for safety purpose is connected to a power supply circuit of a machine within a dangerous area and outputs a high-level signal when all the optical axes are in a non-shielded state, while stops the signal output when any optical axis is shielded. With this configuration, when some sort of object including a person enters the dangerous area, the machine within the dangerous area stops to thereby prevent occurrence of an accident.

However, when it is necessary to prevent the sensor output from stopping due to passage of an object such as a workpiece to be used in the dangerous area or an object to be conveyed by an automated conveyer unit, a muting function is used. In general, to implement this function, an object detection sensor (hereinafter, referred to as "muting sensor") is disposed around the detection area of the multi-axis photoelectric sensor so as to allow an ON-state of the output from the multi-axis photoelectric sensor to be maintained even when the optical axis is shielded on a condition that a detection signal from the muting sensor and a non-shielded/shielded state of the detection area of the multi-axis photoelectric sensor change according to a previously registered sequence.

FIGS. 9 (1) to 9 (4) illustrate an example of the muting processing performed for a workpiece W passing through a conveyance path RD running toward the dangerous area. Reference numeral 1 denotes a projector of the multi-axis photoelectric sensor, and 2 denotes an optical receiver of the multi-axis photoelectric sensor. A pair of muting sensors A1, B1 are arranged on an upstream side (hereinafter, referred to as "safety side") relative to the multi-axis photoelectric sensor and, similarly, a pair of muting sensors A2, B2 are arranged on a downstream side (hereinafter, referred to as "danger side") relative to the multi-axis photoelectric sensor. Although transmission type photoelectric sensors are used as the muting sensors A1, B1, A2, B2 in this example, and projectors and optical receivers of respective muting sensors are alternately arranged, the type and installation method of the muting sensors are not limited to those described above. Further, a device other than the sensor having a function of detecting an object may be used in place of the muting sensors.

FIG. 9 (1) illustrates a state before the muting, in which the workpiece W is located on the upstream side relative to the muting sensors A1, B1. When the workpiece W advances, optical axes of the safety side muting sensors A1, B1 are shielded by the workpiece W in this order. In this example, as illustrated in FIG. 9 (2), when the safety side muting sensors A1, B1 are turned ON, the muting starts before the detection area of the multi-axis photoelectric sensor is shielded. As a result, even when the workpiece W further advances to shield the detection area, the ON-state of the output is maintained.

When the workpiece W enters the danger side, the safety side muting sensors A1, B1 are turned OFF in this order. Whereas, as illustrated in FIG. 9 (3), the danger side muting sensors A2, B2 are tuned ON, whereby the muting state is maintained. When the workpiece W further advances, the detection area of the multi-axis photoelectric sensor is returned to a state where it is not shielded, followed by turning OFF the muting sensor A2. In this example, the turn ON/OFF state is confirmed as described above, and the muting is ended when a state is reached where only the muting sensor B2 is in the ON-state.

Patent Document 1 listed below also describes a technique similar to that illustrated in FIGS. 9 (1) to (4), in which the muting sensor pairs are disposed, respectively, on the safety side and danger side, and muting is performed based on a status change of the detection signals from the respective sensors. In the muting processing described in Patent Document 1, the muting is started when the two safety side muting sensors are turned ON, followed by a state where the danger side muting sensors are turned ON, and the muting is ended when all the photoelectric sensors are turned OFF.

PRIOR ART DOCUMENT

Patent Document

Patent Document 1: Japanese Unexamined Patent Publication No. 2006-284355 (see paragraphs [0025] to [0027], FIG. 2)

SUMMARY OF THE INVENTION

Problems to be Solved by the Invention

For enhancing safety, in the actual muting processing, not only an order of changes of the detection signals of the muting sensors and non-shielded/shielded state of the multi-axis photoelectric sensor, but also whether a time interval between the changes is adequate or not is checked and, when an inadequate change is detected, the muting function is disabled. Further, when there is a need to allow passage of only an object having a specific shape, light axes shielded by this object are previously registered and, when an unregistered optical axis is shielded, or when the light axis that should be shielded is maintained in the non-shielded state, the output is stopped.

Thus, if, for example, an installation interval between the muting sensors is not adequate, or a moving speed of the object is changed, a timing of a change in the detection signal from the muting sensor or a timing of a change in the non-shielded/shielded state of the detection area may mess up, which is detected as abnormality even when an object to which the muting is to be applied is passing. Further, in the case where, in order for allowing passage of only an object having a specific shape, the optical axes to be shielded by the object are previously registered, if the object being moved is rotated, or a moving speed of the object is changed due to complexity of the shape of the object, a shielding pattern with respect to the optical axes constituting the detection area undergoes a change, which may be detected as abnormality.

The above-described state, i.e., the state where the muting function does not work and thus the output is stopped even when the muting-target object is passing is hereinafter referred to as "muting error".

The muting error lowers productivity, so that a cause of the error must be detected and solved. However, a conventional multi-axis photoelectric sensor is designed to only make notification that there has been the abnormality when the abnormality occurs during the muting and thus the processing is stopped. Thus, frontline operators have trouble recognizing what causes the muting error and, the fact is that they perform maintenance work by trial and error.

The present invention has been made focusing on the above-described problem, and an object thereof is to allow easy detection of a cause of the abnormality by reporting under what situation the abnormality concerning the muting processing has occurred.

Means for Solving the Problem

A multi-axis photoelectric sensor according to the present invention has a configuration in which a detection area formed by a plurality of optical axes is set between a projector and an optical receiver disposed opposed to each other. The multi-axis photoelectric sensor includes: detection means that sequentially detects a non-shielded state/a shielded state of the optical axes to determines the non-shielded state/shielded state of the detection area as a whole; signal output means that outputs a high-level signal while the detection means determines that the detection area is in the non-shielded state and stops the signal output when the detection means determines that the detection area is shielded; and muting processing means that temporarily disables the signal output stop function of the signal output means on a condition that the determination results from the detection means and a detection signal input from an external muting device change according to a prescribed sequence.

The muting processing means of the multi-axis photoelectric sensor according to the present invention includes abnormality detection means that divides the sequence of a change in the determination results from the detection means and the detection signal from the muting device for monitoring to detect an abnormality in the sequence in the stage being monitored; output control means that prevents the signal output stop function from being disabled in response to detection of the abnormality by the abnormality detection means; and notification means that outputs, in response to detection of the abnormality by the abnormality detection means, information indicating a type of the stage in which the abnormality has been detected.

With the above configuration, it is possible to execute the muting while confirming that the plurality of stages progress in a prescribed order based on the non-shielded state/shielded state of the detection area or detection signal from the muting device. Further, the abnormality detection processing is executed for each stage and, when any abnormality is detected and the detection area is shielded, the output stop function is effected to stop the output from the multi-axis photoelectric sensor. At this time, the information indicating the type of the stage in which the abnormality has been detected is output, allowing a user to easily identify in which stage the abnormality has occurred. Thus, a number of causes that can bring about the abnormality can be narrowed down to those of only the abnormality that can occur in the identified stage, thereby making it possible for the user to easily identify the cause of the abnormality.

In the multi-axis photoelectric sensor according to a preferred embodiment, the abnormality notification means includes display means that displays the type of the stage in which the abnormality has been detected in a display mode differing from one stage to another. For example, in a case where an indicator light is used, the type of the stage in which the abnormality has occurred can be notified by the number of times of blinking. Further, in a case where a digital display unit is used, the number or a symbol indicating the type of the stage in which the abnormality has occurred can be displayed.

In the multi-axis photoelectric sensor according to another preferred embodiment, the abnormality notification means includes output means that outputs, to an external device, the information indicating the type of the stage in which the abnormality has been detected. This allows the user to confirm the type of the stage in which the abnormality has occurred using an external display device. When the output information is input to an information processor such as a personal computer, causes of the abnormality that has occurred can be automatically narrowed down in the information processor based on the information indicating the type of the stage, thereby allowing presentation of the narrowed-down causes and corresponding countermeasures to the user. Further, when, in addition to the information indicating the type of the stage in which the abnormality has been detected, information indicating content of the detected abnormality is output, the cause of the abnormality can be identified more accurately.

In the multi-axis photoelectric sensor according to still another preferred embodiment, the muting processing means further includes history information creation means that creates, for each abnormality detected by the abnormality detection means, history information associating the information indicating the type of the stage in which the abnormality is detected, with the content of the detected abnormality; storage means that stores the history information; and history information output means that reads out the history information from the storage means and outputs the read out history information to an external device. With this configuration, by inputting the history information of the previous abnormalities to an information processor such as a personal computer and collating the stage in which the abnormality has been detected and the content thereof, the cause of the muting error can be analyzed in detail.

Effect of the Invention

According to the multi-axis photoelectric sensor of the present invention, when the muting error has occurred, it is possible to easily grasp under what situation the muting error has occurred, allowing a cause of the muting error to be easily identified and removed.

BRIEF DESCRIPTION OF THE DRAWINGS

FIG. 5 is a table associating a schematic view illustrating a positional relationship between a workpiece and sensors in each stage of a muting sequence with statuses of muting inputs or a status of a detection area and contents of typical abnormalities detected in each stage;

FIG. 9 is a view for explaining a flow of the muting processing.

MODE FOR CARRYING OUT THE INVENTION

Figure 1:
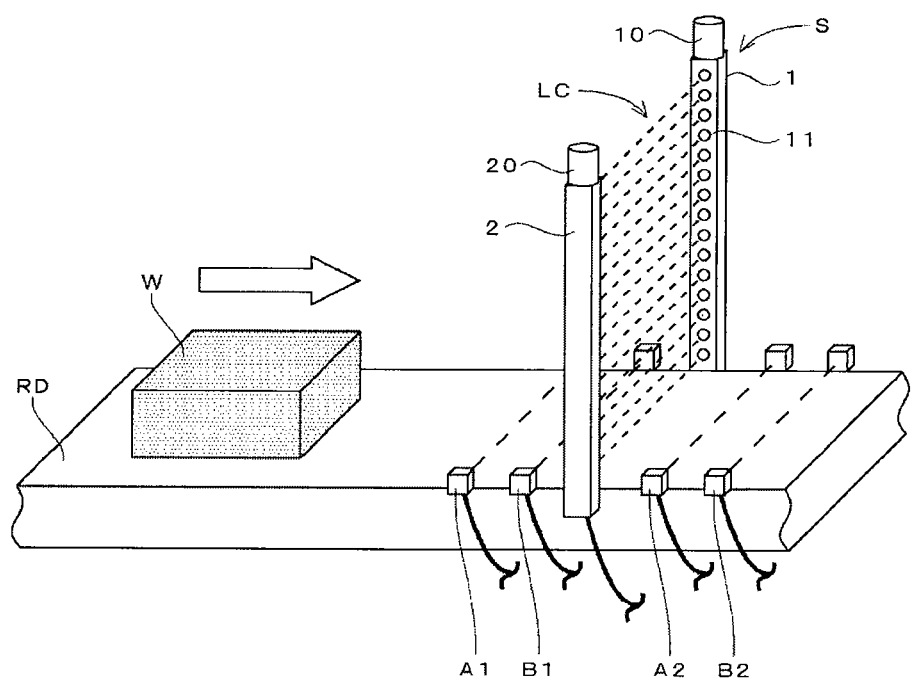
FIG. 1 is a view illustrating an installation example of a multi-axis photoelectric sensor and muting devices.

FIG. 1 illustrates an installation example of a multi-axis photoelectric sensor and muting devices. A multi-axis photoelectric sensor S of the present embodiment includes a projector 1 and an optical receiver 2 disposed opposite to each other across a conveyance path RD running toward the dangerous area. The projector 1 includes a plurality of light emitting elements 11, and the optical receiver 2 includes light receiving elements 21 (see FIG. 2) whose number is equal to that of the light emitting elements 11. The light emitting elements 11 and light receiving elements 21 are positioned in one-to-one relationship with each other, whereby a two-dimensional detection area LC formed by a plurality of optical axes is set.

Two pairs of muting sensors (a pair of sensors A1, B1, and a pair of sensors A2, B2) are arranged, as the muting devices, on an upstream side and downstream side relative to the multi-axis photoelectric sensor S, respectively. The muting sensors A1, B1, A2, B2 as a concrete example are transmission type photoelectric sensors. However, the present invention is not limited to this, but other types of sensors, such as a reflection type photoelectric sensor and a proximity sensor, or equipment other than a sensor having a function of detecting an object may be used depending on a material of a workpiece W.

A detection signal from the above multi-axis photoelectric sensor S is output to a power supply circuit (not illustrated) of a machine within a dangerous area. A high-level signal is output normally, and when the detection area LC is shielded, the output is stopped (in other words, the output is switched from a high level to a low level). However, in the present embodiment, a muting state is set while the workpiece W is passing through the detection area LC so as to prevent the output from being stopped due to the passage of the workpiece W.

Indicator lights 10, 20 for indication concerning the muting are mounted, respectively, to upper portions of casings of the projector 1 and optical receiver 2. The indicator lights 10, 20 are turned on during the muting and, when an abnormality occurs, report the corresponding information by light blinking. The abnormality concerning the muting may occur not only during the muting, but also before start of the muting. Further, the abnormality concerning the muting includes an abnormality caused by an object (e.g., human body) other than a registered workpiece W and an abnormality (muting error) caused due to inadequacy of sensor setting or a change in a moving speed or an attitude of the workpiece W.

Figure 2:
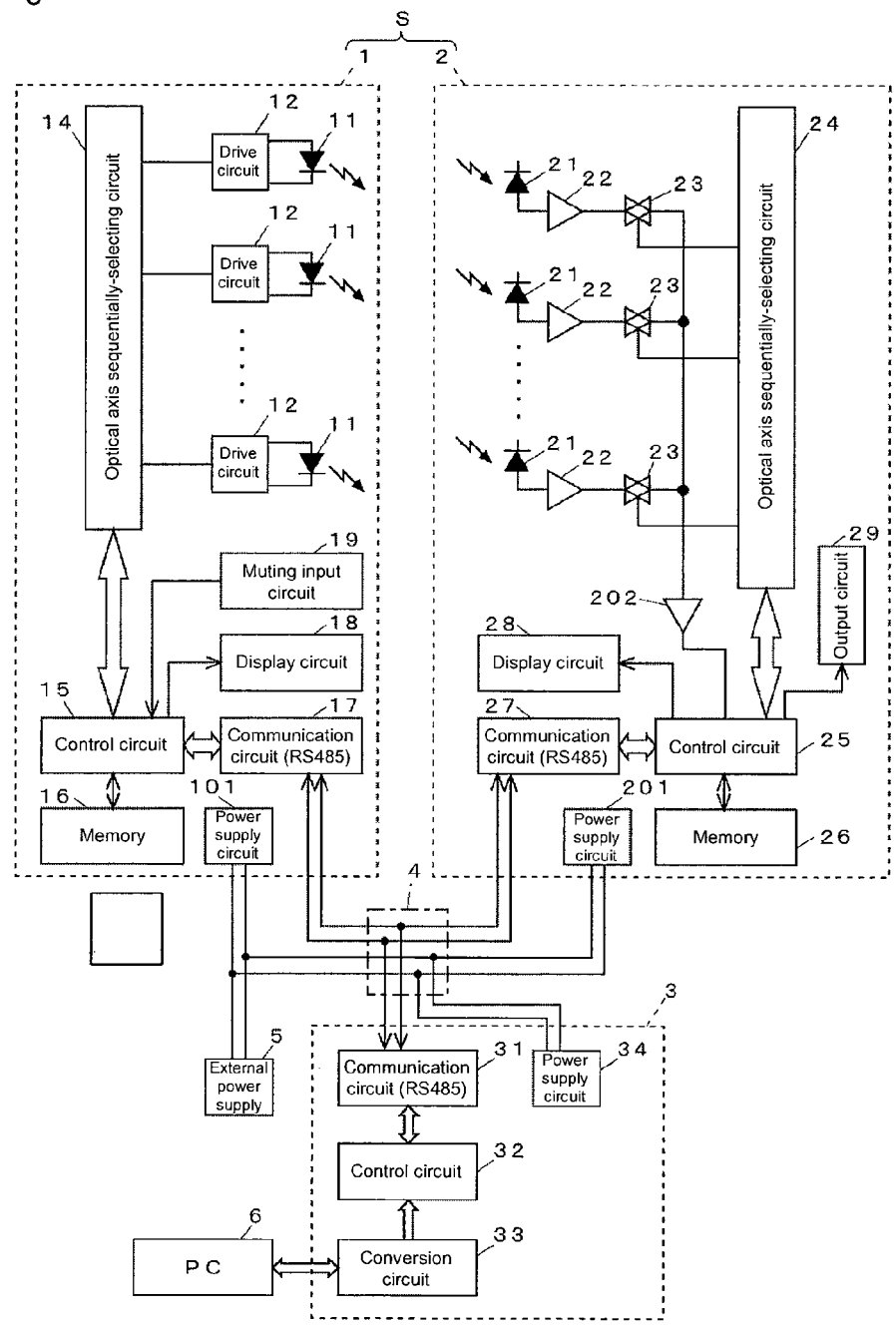
FIG. 2 is a block diagram illustrating a configuration of the multi-axis photoelectric sensor and a configuration of a converter for connecting to an external device.

FIG. 2 is a block diagram illustrating a configuration of the multi-axis photoelectric sensor S.

The projector 1 includes, in a casing thereof, a plurality of LEDs as the light emitting elements 11 and further includes a drive circuit 12 provided for each light emitting element 11, an optical axis sequentially-selecting circuit 14, a control circuit 15, a memory 16, a communication circuit 17, a display circuit 18, a muting input circuit 19, and a power supply circuit 101.

The optical receiver 2 includes, in a casing thereof, a plurality of photodiodes as the light receiving elements 21 and further includes an amplifier 22 and an analog switch 23 provided for each light receiving element 21. The optical receiver 2 further includes an optical axis sequentially-selecting circuit 24, a control circuit 25, an amplifier 202 provided on an output line connecting the individual analog switches 23 and control circuit 25, a memory 26, a communication circuit 27, a display circuit 28, an output circuit 29, and a power supply circuit 201.

The communication circuits 17, 27 conform to RS485 standards. The power supply circuits 101, 102 receive power supply from a common external power supply 5 and generate electric power for driving the circuits in the casings. The control circuits 15, 25 are microcomputers and operate at the same timing by communicating with each other through the communication circuits 17, 27.

The display circuits 18, 28 are used for control of the above-mentioned indicator lights 10, 20, respectively.

The output circuit 29 in the optical receiver 2 is connected to a switch mechanism (not illustrated) incorporated in a power supply circuit for a machine within the dangerous area. When the output from the output circuit 29 assumes an ON-state (high level), the switch mechanism is closed to supply power to the machine within the dangerous area; on the other hand, when the output from the output circuit 29 assumes an OFF-state (low level), the switch mechanism is opened to stop the machine.

The optical axis sequentially-selecting circuits 14, 24 of the projector 1 and optical receiver 2 are each a gate circuit for sequentially enabling the optical axes one by one. The control circuits 15, 25 of the projector 1 and optical receiver 2 communicate with each other to switch, at a synchronized timing, selection of the optical axes by the optical axis sequentially-selecting circuits 14, 24 and output a timing signal. As a result, the light emitting elements 11 of the respective optical axes of the projector 1 are sequentially turned on. In synchronization with this, in the optical receiver 2, a light receiving amount signal generated in the light receiving element 21 corresponding to the turned-on light emitting element 11 is input to the control circuit 25.

The control circuits 15, 25 each compare an hourly light receiving amount with a predetermined threshold to determine whether each light axis is in a non-shielded state or a shielded state. Further, the control circuits 15, 25 each integrate results of the determinations made on respective optical axes every go-around of the selection of the optical axes and determine the non-shielded state/shielded state of the detection area LC as a whole.

The memories 16, 26 store therein a program, a parameter, and the like required for the corresponding control circuits 15, 25 to operate. Further, the memories 16, 26 each include an area for storing history data concerning an abnormality detected in sequence monitoring processing to be described later.

A communication line between the projector 1 and optical receiver 2 and a power supply line between the external power supply 5 and power supply circuits 101, 201 are connected to a converter 3 through a branch connector 4. The converter 3 includes a communication circuit 31 conforming to the RS485 standards, a control circuit 32, a conversion circuit 33, and a power supply circuit 34. The communication line and power supply line between the projector 1 and optical receiver 2 are branched by the branch connector 4 to be connected to the communication circuit 31 and power supply circuit 34 of the converter 3, respectively.

The power supply circuit 34 receives supply of the power from the external power supply 5 through a branched power line and generates electric power required for the circuits in the converter 3 to operate. The conversion circuit 33 has a function of converting a signal conforming to the RS485 standards, the signal being handled by the control circuits 15, 25 of the projector 1 and optical receiver 2, into a signal conforming to RS282C standards or USB standards and vice versa. An RS282C port or a USB port is connected to a personal computer 6 (abbreviated as "PC" in the drawing) as needed basis.

The personal computer 6 is connected as needed basis when operation setting of the multi-axis photoelectric sensor S is performed or an operating status thereof is confirmed. When a user performs an operation for the personal computer 6 to make a setting concerning the operation of the sensor S (including a setting concerning the muting), the set information is given to the control circuits 15, 25 of the projector 1 and optical receiver 2 through the converter 3 and communication circuits 17, 27 and then registered in the memories 16, 26. Further, also when an operation specifying readout of information stored in the memories 16, 26 is performed in the personal computer 6, a command associated with this operation is given to the control circuits 15, 25 of the projector 1 and optical receiver 2 along the same route, and the information that the control circuits 15, 25 read out from the memories 16, 26 in response to the given command is transmitted, along a reverse route to that described above, to the personal computer 6.

Figure 3:
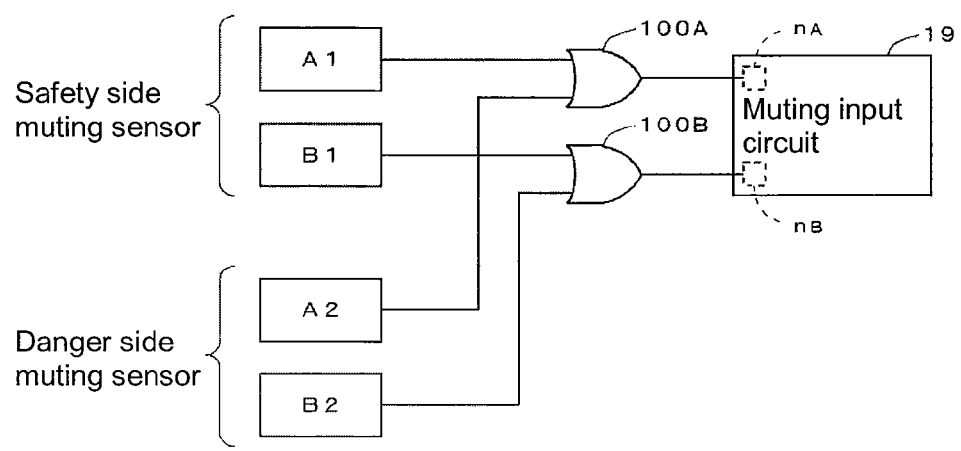
FIG. 3 is a view illustrating a circuit configuration concerning connection among the muting sensors.

The muting input circuit 19 of the projector 1 is provided for receiving a detection signal from the muting sensors A1, B1, A2, B2 and includes two input ports $n_A$, $n_B$, as illustrated in FIG. 3. In the present embodiment, the safety side muting sensors A1, B1 and danger side muting sensors A2, B2 are grouped into a combination of the sensors A1, A2 which are upstream side ones in the safety side and danger side, respectively, and a combination of the sensors B1, B2 which are downstream side ones in the safety side and danger side, respectively. Outputs from the sensors A1, A2 are connected to the input port $n_A$ through an OR circuit 100A, and outputs from the sensors B1, B2 are connected to the input port $n_B$ through an OR circuit 100B.

Signals input through the input port $n_A$, $n_B$ are input to the control circuit 15 of the projector 1 and then transmitted to the control circuit 25 of the optical receiver 2 through the communication circuits 17, 27.

Hereinafter, the signal input from the muting sensors A1, A2, through the OR circuit 100A and input port $n_A$, is referred to as "muting input A", and the signal input from the muting sensors B1, B2, through the OR circuit 100B and input port $n_B$, is referred to as "muting input B".

Figure 4:
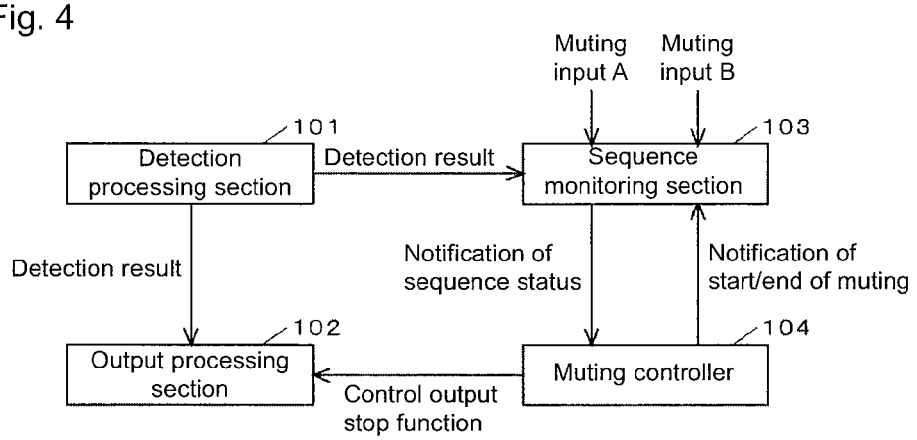
FIG. 4 is a block diagram illustrating functions implemented in the control circuits of the projector and optical receiver.

FIG. 4 illustrates main functions implemented in the control circuits 15, 25 together with a relationship between the functions. In the present embodiment, execution of a program stored in the memories 16, 26 allow each of the control circuits 15, 25 to operate as a detection processing section 101, an output processing section 102, a sequence monitoring section 103, and a muting controller 104.

The detection processing section 101 sequentially enables the optical axes of the projector 1 and optical receiver 2, repeats the processing of determining the non-shielded state/shielded state of each of the enabled optical axes while controlling a light projecting/receiving operation thereof, and determines the non-shielded state/shielded state of the detection area LC as a whole every go-around of the determination processing for respective optical axes. The output processing section 102 controls signal output from the output circuit 29 of the optical receiver 2. While the detection processing section 101 determines that the detection area LC is in the non-shielded state, the output processing section 102 maintains the output in the ON-state (high level). When the detection processing section 101 determines that the detection area LC is shielded, the output processing section 102 switches the output to the OFF-state (low level). Hereinafter, the function of switching the output to the OFF-state in response to the shielding of the detection area LC is referred to as "output stop function".

The muting processing is realized by cooperation between the sequence monitoring section 103 and muting controller 104. In FIG. 4, as a matter of convenience, a relationship between the sequence monitoring section 103 and muting controller 104 is defined such that "notification" is exchanged between them.

The sequence monitoring section 103 monitors whether or not the muting inputs A, B and non-shielded state/shielded state of the detection area LC determined by the detection processing section 101 change according to a prescribed sequence. The muting controller 104 determines, based on notification from the sequence monitoring section 103, whether the sequence satisfies a start condition or stop condition of the muting and disables the output stop function of the output processing section 102 during the time between establishment of the start condition and establishment of the end condition. This disabling processing corresponds to the muting processing. This disables the output stop function even when the shielded state of the detection area LC is detected by the detection processing section 101, with the result that the output circuit 29 is maintained in a state where the output circuit 29 outputs the high-level signal.

The sequence monitoring section 103 turns on the indicator lights 10, 20 during the muting state based on the notification from the muting controller 104. This gives notification that the muting is being effected.

However, the above-described control is performed on the assumption that the sequence monitoring section 103 determines that there occurs no abnormality in the sequence. When it is determined, before the start of the muting, that there occurs an abnormality in the sequence, the muting controller 104 never disables the output stop function. Further, in a case where the output stop function has already been disabled (i.e., the muting is effected) when it is determined that there occurs an abnormality in the sequence, the muting controller 104 immediately cancel the disabled state. Thus, when there occurs an abnormality in the sequence, the output from the output circuit 29 is switched to the OFF-state in response to the shielding of the detection area LC. The sequence monitoring section 103 turns on the indicator lights 10, 20 in response to the determination of the abnormality occurrence.

The muting monitoring section 103 in the present embodiment divides the above-described sequence into a plurality of stages and monitors progression of each stage and abnormality occurrence by programs prepared for individual stages. The muting monitoring section 103 detects an abnormality matching the current stage based on the programs while recognizing the progress of the stages FIG. 5 is a table associating a schematic view illustrating a positional relationship between the workpiece W and sensors in each stage with statuses of the muting inputs A, B or a status of the detection area LC in each stage and contents of typical abnormalities detected in each stage. In FIG. 5, for simplification of notation, the muting inputs A, B are referred to merely as "A, B", and the detection area LC is merely as "LC".

As illustrated in FIG. 5, in the present embodiment, the muting sequence is divided into seven stages. Of all the stages, <stage 1>, <stage 2>, <stage 3> correspond to a state before the muting. More specifically, the <stage 1> corresponds to a state where the workpiece W is located on the upstream side relative to the safety side muting sensors A1, B1, <stage 2> corresponds to a state where the workpiece W has advanced to a position where it shields the optical axis of the muting sensor A1 positioned on the upstream side relative to the muting sensor B1. The <stage 3> corresponds to a state where the workpiece W has advanced to a position where it shields the optical axis of the muting sensor B1.

In the present embodiment, the muting is started after elapse of a certain time T from start of the <stage 3>. A <stage 4> corresponds to a state where the muting is started. In this stage, the work piece W has not yet reached the detection area LC.

A <stage 5> corresponds to a state where the detection area LC is shielded by the workpiece W. A <stage 6> corresponds to a state where the workpiece W goes out of the detection area LC and shields the optical axes of the danger side muting sensors A2, B2.

In the present embodiment, the muting is ended when the workpiece W advances further from the state of the <stage 6> to release the shielding of the optical axes of the muting sensor A2 (i.e., when the muting input A is switched from ON to OFF). A <stage 7>, which is the last stage, corresponds to a state where the muting is ended.

According to the above description, the detection area LC is not shielded in the stages other than the <stage 5>. Further, in the present embodiment, it is assumed that the sensors are installed such that an interval between the muting sensors A1, A2 and an interval between the muting sensors B1, B2 are each smaller than a length of the workpiece W in a direction along the conveyance path RD, so that the muting inputs A, B should be in the ON-state during the time between start of the <stage 3> and end of the <stage 6>.

The sequence monitoring section 103 executes a monitoring program for <stage 1> while both the muting inputs A, B are in the OFF-state and executes a monitoring program for <stage 2> when the muting input A is switched from the OFF-state to ON-state. Further, when the muting input B is switched from the OFF-state to ON-state, the sequence monitoring section 103 executes a monitoring program for <stage 3>.

When the muting controller 104 starts the muting after elapse of the time T from the start of the <stage 3>, the sequence monitoring section 103 executes a monitoring program for <stage 4>. Further, the sequence monitoring section 103 executes a monitoring program for <stage 5> when the detection area LC is switched from a non-shielded state to shielded state and then executes a monitoring program for <stage 6> when the detection area LC returns to the non-shielded state. Then, the sequence monitoring section 103 executes a monitoring program for <stage 7> when the muting controller 104 end the muting after the muting input A is switched from the ON-state to OFF-state.

After that, when the muting input B is switched from the ON-state to OFF state, the sequence monitoring section 103 executes the monitoring program for <stage 1>.

The following describes processing of detecting typical abnormalities in each stage.

In the <stage 1>, a case where changes in the muting inputs A, B do not satisfy a condition for advancing to the <stage 2> and <stage 3> is detected as an abnormality. In the <stage 2>, cases where an event (switching of the muting input B from OFF-state to ON-state) indicating that the processing stage has advanced to the <stage 3> occurs before elapse of a minimum waiting time and where the switching of the muting input has not occurred even after elapse of a maximum waiting time are detected as an abnormality.

In the <stage 3>, a case where the detection area LC is shielded before elapse of the waiting time T which is a condition for advancing to the <stage 4> is detected as an abnormality. In the <stage 4>, <stage 5>, <stage 6>, as in the <stage 2>, cases where an event indicating that the processing stage has advanced to the next stage occurs before elapse of a minimum waiting time and where the event has not occurred even after elapse of a maximum waiting time are detected as an abnormality. The minimum waiting time or maximum waiting time is registered for each stage.

The abnormalities to be detected in the <stage 2> to <stage 6> may occur due to inadequacy of the moving speed of the workpiece W or positional relationship among the muting sensors A1, B1, A2, B2.

In the <stage 7>, a case where the muting input A assumes the ON-state again before the muting input B assumes the OFF state is detected as an abnormality. This abnormality may occur when a subsequent workpiece W' shields the optical axis of the safety side muting sensor A1 before completion of the processing for the current workpiece W, as illustrated in the schematic view of the <stage 7> of FIG. 4.

In addition, in each stage other than the <stage 5>, a case where the detection area LC is shielded is detected as an abnormality. Further, in a case where, in order for allowing passage of only a workpiece W having a specific shape, the optical axes to be shielded by the workpiece W are previously registered, a case where unregistered optical axis is shielded, or where the registered light axis is not shielded is detected as an abnormality in the stage <stage 5>. This abnormality may occur when the workpiece being moved is rotated, or the moving speed of the workpiece W is changed.

Further, in the <stage 2> to <stage 6>, a case where one of the muting inputs A, B that should be maintained in the ON-state is switched to the OFF-state is detected as an abnormality. This abnormality may occur when the optical axes of the muting sensors A1, B1, A2, B2 are shielded by an object other than the workpiece W or due to inadequacy of the installation positions of the muting sensors A1, B1, A2, B2.

As described above, the sequence monitoring section 103 executes the monitoring program corresponding to the current stage in response to a change in the statuses of the muting inputs A, B or a status of the detection area LC while confirming transition of the stages. When detecting any abnormality, the sequence monitoring section 103 blinks the indicator lights 10, 20 by the number of times corresponding to the ordinal number of the stage in which the abnormality has occurred (for example, in a case where the abnormality has occurred in the <stage 1>, the indicator lights 10, 20 are blinked once; in a case where the abnormality has occurred in the <stage 2>, the indicator lights 10, 20 are blinked twice).

A manual organizing, on a per-stage basis, the contents of the abnormalities that can occur in each stage and countermeasures against the abnormalities is provided to a user as a print medium or electronic data. In this manual, information organized on a per-stage basis is presented in association with the number of times of blinking of the indicator lights 10, 20 at the time of occurrence of the abnormality. Thus, the user can easily estimate a cause of the abnormality by referring to the manual using the number of times of blinking as an index and can thus take appropriate measures.

Figure 6:
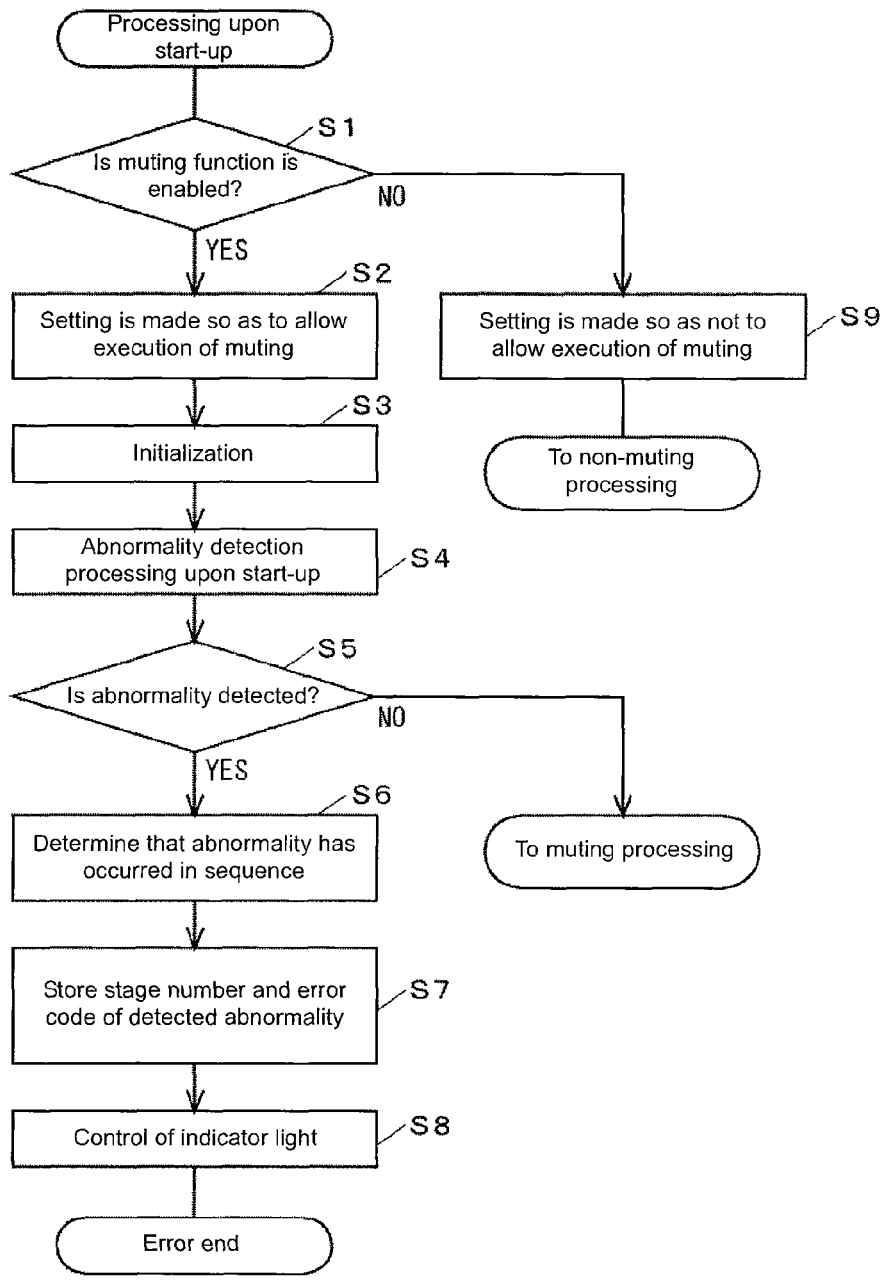
FIG. 6 is a flowchart illustrating a procedure of processing to be performed upon start-up.
Figure 7:
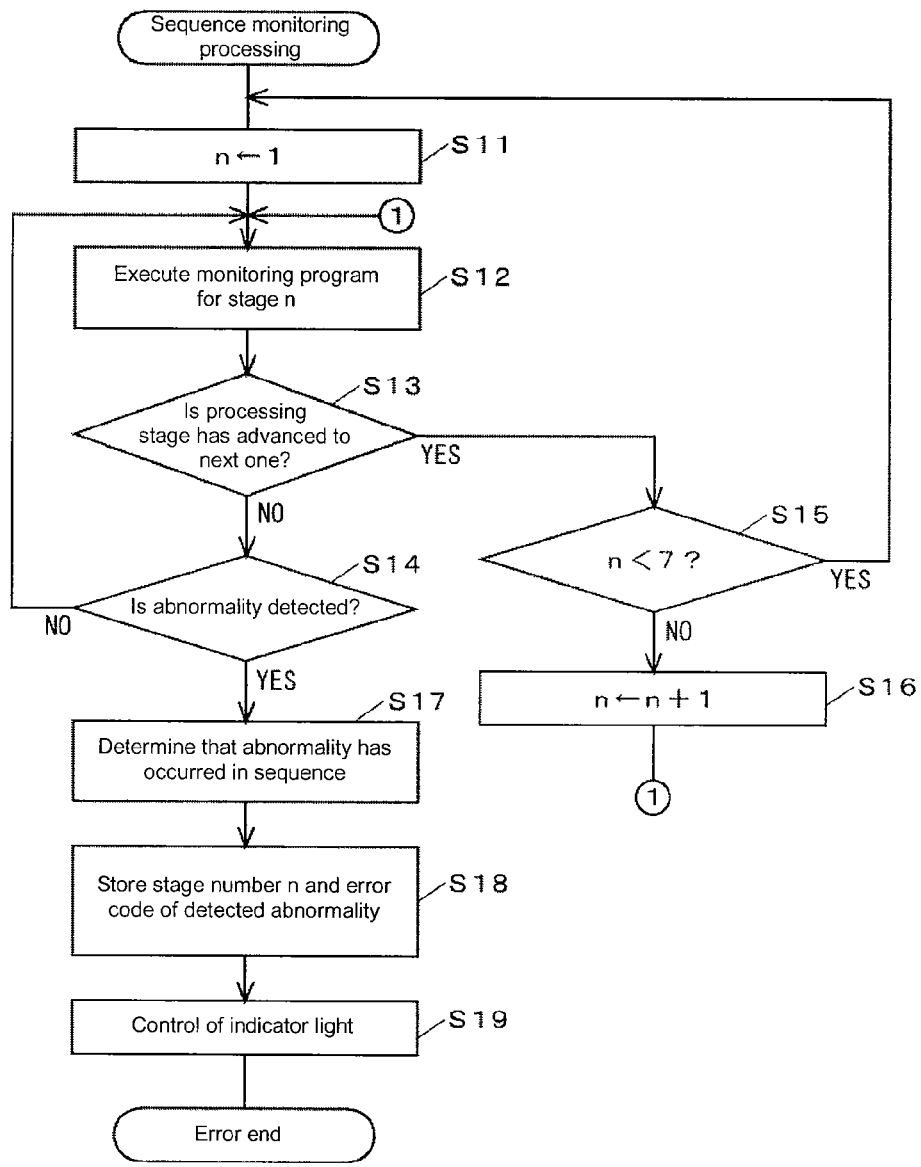
FIG. 7 is a flowchart illustrating a procedure of muting processing.

The following describes operation of the multi-axis photoelectric sensor S concerning the muting processing with reference to FIGS. 6 and 7. The control circuits 15, 25 of the projector 1 and optical receiver 2 execute the muting processing at a synchronized timing while confirming consistency between processing results thereof.

FIG. 6 illustrates a procedure of processing to be performed upon start-up of the multi-axis photoelectric sensor S. First, it is checked whether or not a setting wire is set so as to enable the muting function. When a setting disabling the muting function is made ("NO" in step S1), a processing flow shifts to step S9, where a setting is made such that the muting processing is not executed. When this setting is made, the processing flow shifts to not illustrated non-muting processing, where when the shielded state of the detection area LC is detected in the detection processing, the output from the output circuit 29 is turned OFF without exception.

When a setting enabling the muting function is made ("YES" in step S1), the muting processing is executed in step S2. In step S3, as initialization, setting of parameters (waiting time in each stage, etc.) for use in determination on progress of each processing step or detection of the abnormality or rest of variables for computation are executed.

In step S4, abnormality detection processing upon start-up is executed. This processing is executed, as a part of the function of the sequence monitoring section 103, for detecting a case where the multi-axis photoelectric sensor S is powered on in a state where any of the muting sensors A1, B1, A2, B2 or the multi-axis photoelectric sensor S is shielded. When the abnormality is detected in this processing ("YES" in step S5), it is determined that the abnormality occurs in the sequence in step S6, and the stage number of the stage 1 and an error code indicating a type of the detected abnormality are stored in the memories 16, 26 (step S7). In step S8, the indicator lights 10, 20 are blinked by the number of times (i.e., once) corresponding to the stored stage number, to thereby make notification that the abnormality has occurred in the first stage (step S8). The single blinking may be repeated at a time interval sufficiently longer than a blinking interval set when the lights 10, 20 are blinked more than once. In this case, a state where the processing is stopped continues until the abnormality is removed.

When the abnormality is not detected in the abnormality detection processing ("NO" in step S5), the processing flow shifts to the muting processing. In the muting processing, sequence monitoring processing illustrated in FIG. 7 is executed by the sequence processing section 103 in parallel to not illustrated processing to be performed by the detection processing section 101, output processing section 102, and muting controller 104.

In the processing of FIG. 7, a stage number n is initially set to 1 (step S11), and a monitoring program corresponding to the stage number n is executed. The monitoring program detects a change in the statuses of the muting inputs A, B or a change in the determination result (non-shielded state or shielded state) on the detection area LC in each detection processing and determines whether the change satisfies a condition for advancing to the next stage or corresponds to the abnormality.

When it is determined that the abnormality does not occur, but a change satisfying the condition for advancing to the next stage occurs ("YES" in step S13), a value of n is checked for update of the stage number (step S15). When the value of n is smaller than 7, the processing flow advances to step S16, where n is incremented. After update of the stage number n, the processing flow returns to step S12, where a monitoring program corresponding to the updated stage number is executed.

When any abnormality is detected by execution of the monitoring program ("YES" in step S14), it is determined that the abnormality has occurred in the sequence (step S17), and the current stage number n and error code of the detected abnormality are stored in the memories 16, 26 in association with the current time (step S18). In step S19, control of blinking the indicator lights 10, 20 by n times is executed. This notifies the user of occurrence of the abnormality and the stage in which the abnormality has occurred.

Also in step S19, the n-time blinking is desirably repeated at a time interval sufficiently longer than a blinking interval. This allows the user to find occurrence of the abnormality by a first blinking operation and to confirm the number of times of blinking by a subsequent blinking operation. Then, the user refers to the above-mentioned manual based on the confirmed number of times of blinking, thereby narrowing down the type of the abnormality to one having a high possibility of occurrence.

A method of notifying the user of occurrence of the abnormality is not limited to the blinking of the indicator lights 10, 20. For example, a digital display unit for displaying the stage number of a stage in which the abnormality has occurred may be provided on a side surface, etc., of the casing of the projector 1 or optical receiver 2. Alternatively, seven LEDs may be provided, and in this case, the LEDs are turned on by the number corresponding to the stage number of a stage in which the abnormality has occurred. In a case where the projector 1 or optical receiver 2 is provided with an auxiliary output terminal, it is possible to output the stage number or error code to an external device (e.g., a display panel) through the terminal.

In a case where the personal computer 6 is connected to the converter 3 illustrated in FIG. 2 after the output is stopped due to detection of the abnormality, the stage number or error code stored in the memories 16, 26 can be read out and transmitted to the personal computer 6. The personal computer 6 has previously registered therein electronic data of the manual and thus can display information assisting user's maintenance work based on the transmitted information.

Figure 8:
FIG. 8 is a view illustrating an example of a display screen for assisting maintenance work.

FIG. 8 illustrates an example of a display screen for assisting the maintenance work. The screen of this example is displayed when the abnormality is detected in the stage 2 and includes a table 60 organizing, in terms of the abnormality type, a cause of the abnormality that can be detected in the stage 2 and countermeasures thereagainst based on the stage number transmitted from the multi-axis photoelectric sensor S. Further, in the table 60, information concerning the abnormality corresponding to the error code transmitted from the multi-axis photoelectric sensor S is colored (in FIG. 7, represented by a halftone pattern).

The above assistance screen allows the user to easily grasp the cause of the muting error and countermeasures for removing the error, thereby facilitating his or her work.

The information to be output to the personal computer 6 is not limited to information concerning the latest abnormality, but a combination of the stage number and error code concerning a plurality of previous abnormalities may be output based on the information stored in the memories 16, 26.

Not only after detection of the abnormality, but also in a case where the muting processing is performed in a state where the personal computer 6 is connected to the multi-axis photoelectric sensor S through the converter 3, the stage number n and error code may be transmitted to the personal computer 6 at the same time as the turning-on of the indicator lights 10, 20. In this case, when the output is stopped in response to the abnormality detection, the assistance screen as illustrated in FIG. 8 can be displayed immediately.

In the above embodiment, as the muting sensors A1, B1, A2, B2, the projector and optical receiver of the transmission type photoelectric sensors are disposed so as to opposite to each other across the conveyance path RD. However, the present invention is not limited to this, an installation method of the muting sensors may be modified as needed. The number of the muting inputs is not limited to two, but three or more muting inputs may be accepted, and the muting sensors may be connected individually to the multi-axis photoelectric sensor S.

In a case where the installation or connection method of the muting sensors is modified, it is possible to divide a sequence of a change in the status of the muting input or the detection area LC into the plurality of stages for monitoring, to stop the output when the abnormality is detected, and to notify the user of the stage in which the abnormality has occurred, as in the above-described embodiment.

DESCRIPTION OF SYMBOLS

S: Multi-axis photoelectric sensor
LC: Detection area
A1, A2, B1, B2: Muting sensor
W: Workpiece
1: Projector
2: Optical receiver
11: Light emitting element
21: Light receiving element
10, 20: Indicator light
15, 25: Control circuit
16, 26: Memory
18, 28: Display circuit
19: Muting input circuit
29: Output circuit

The invention claimed is:

1. A multi-axis photoelectric sensor comprising;
a projector and an optical receiver disposed opposed to each other, between which a detection area is formed by a plurality of optical axes;
a detector that sequentially detects a non-shielded state and a shielded state of the optical axes to determine the non-shielded state and the shielded state of the detection area as a whole;
a signal output that outputs a high-level signal while the detector determines that the detection area is in the non-shielded state and stops the signal output when the detector determines that the detection area is in the shielded state; and
a muting processor that temporarily disables the signal output stop function of the signal output when the determination results from the detector and a detection signal input from an external muting device change according to a prescribed sequence, wherein
the muting processor includes an abnormality detector that divides into a plurality of stages the sequence of a change in the determination results from the detector and the detection signal from the muting device for monitoring to detect an abnormality in the sequence in the stage being monitored; an output controller that prevents the signal output stop function from being disabled in response to detection of the abnormality by the abnormality detector; and a notifier that outputs, in response to detection of the abnormality by the abnormality detector, information indicating a stage in which the abnormality has been detected.

2. The multi-axis photoelectric sensor according to claim 1, wherein the abnormality notifier includes a display that displays a type of the stage in which the abnormality has been detected in a display mode that differs from one stage to another stage.

3. The multi-axis photoelectric sensor according to claim 1, wherein the abnormality notifier includes an output that outputs, to an external device, the information indicating a type of the stage in which the abnormality has been detected.

4. The multi-axis photoelectric sensor according to claim 3, wherein the output outputs, in addition to the information indicating the type of the stage in which the abnormality has been detected, information indicating content of the detected abnormality.

5. The multi-axis photoelectric sensor according to claim 1, wherein the muting processor further includes a history information creator that creates, for each abnormality detected by the abnormality detector, history information associating the information indicating a type of the stage in which the abnormality has been detected, with the content of the detected abnormality; a storage that stores the history information; and a history information output that reads out the history information from the storage and outputs the read out history information to an external device.

6. The multi-axis photoelectric sensor of claim 1, further comprising:
blinker lights that are blinked a number of times corresponding to the stage in which the abnormality is detected to provide a notification of the stage in which the abnormality has been detected.

* * * * *